United States Patent
Poole et al.

[11] Patent Number: 6,027,989
[45] Date of Patent: Feb. 22, 2000

[54] BANDGAP TUNING OF SEMICONDUCTOR WELL STRUCTURE

[75] Inventors: Philip J. Poole, Ottawa; Sylvain Charbonneau, Cumberland; Geofrey C. Aers, Orleans; Michael Davies; Emil S. Koteles, both of Ottawa, all of Canada

[73] Assignee: National Research Council of Canada, Ottawa, Canada

[21] Appl. No.: 08/894,725

[22] PCT Filed: Feb. 28, 1996

[86] PCT No.: PCT/CA96/00121

§ 371 Date: Oct. 28, 1997

§ 102(e) Date: Oct. 28, 1997

[87] PCT Pub. No.: WO96/27226

PCT Pub. Date: Sep. 6, 1996

[30] Foreign Application Priority Data

Feb. 28, 1995 [CA] Canada ................................. 9503981

[51] Int. Cl.[7] .................................................. H01L 21/22
[52] U.S. Cl. ............................ 438/522; 438/22; 438/45; 438/46
[58] Field of Search ................................. 438/22, 23, 29, 438/31, 36, 45, 46, 47, 500, 502, 507, 509, 511, 514, 518, 522

[56] References Cited

PUBLICATIONS

P.G. Piva et al., "Bandgap tuning of semiconductor quantum well structures using ion implantation," Superlattices and Microstructures, 15 (4), pp. 385–390 (no month given), 1994.

L.A. Coldren et al., Diode lasers and photonic integrated circuits, John Wiley and Sons, pp. vii–xv (no month given), 1995.

*Primary Examiner*—Chandra Chaudhari
*Assistant Examiner*—Keith Christianson
*Attorney, Agent, or Firm*—Mark & Clerk

[57] ABSTRACT

In a method of bandgap tuning of a quantum well heterostructure wherein ions are implanted in the heterostructure by ion implantation, the ions are implanted so that different regions are implanted in such a way as to create different concentrations of defects. This provides varying bandgap energies to various areas of the heterostructure during a subsequent thermal treatment, which removes residual defects and initiates intermixing in the quantum well region to result in a structure having a selectively shifted bandgap.

8 Claims, 8 Drawing Sheets

BANDGAP TUNING OF SEMICONDUCTOR WELL STRUCTURE

This invention relates to semiconductor heterostructures and, more specifically, to a method of bandgap tuning a quantum well structure in a spatially selective manner.

The invention can also be applied to post processing to modify device properties. The invention provides a useful and new method for the monolithic integration of multi-use devices on a single substrate with simplified growth topology.

Optical and electrical properties of quantum well structures are of great importance for novel semiconductor device applications. The ultimate goal of monolithic integration of optical, optoelectronic and electronic components requires the capability for controllable lateral and vertical modifications of optical constants and electrical characteristics in such components.

Present techniques include etching and regrowth. Regrowth involves growing a device structure such as a laser, and then etching away the regions where other components, such as modulators etc., are desired and regrowing these components. This involves a large number of processing steps, with problems associated with growing good quality material after etching, leading to poor device yields.

U.S. Pat. No. 5,238,868 describes in detail. a technique for shifting the bandgap using quantum well intermixing. This technique involves mixing quantum well material with surrounding barrier material to change the bandgap of the quantum well. This is performed by introducing impurities or defects into the quantum well in the region of the wafer that requires a modification of the bandgap. The implanted wafer is then annealed to intermix the defects and shift the bandgap. This technique does not, however, permit different regions of the wafer to be selectively tuned.

An object of the invention is to alleviate these problems.

According to the present invention there is provided a method of bandgap tuning a quantum well heterostructure wherein ions are implanted into the heterostructure to create defects therein, and the heterostructure is then thermally treated, e.g. annealed, to initiate intermixing in the quantum well region, characterized in that different regions are implanted with ions in a spatially selective manner to create different concentrations of defects and thereby result in different bandgap shifts during subsequent treatment.

Tuning the bandgap of a quantum well structure during subsequent thermal treatment in a spatially selective manner in this way is a powerful technique for performing monolithic integration. This allows the fabrication of lasers (of many wavelengths), detectors, waveguides, modulators, etc. on a single wafer.

In one embodiment, the ions are implanted through a mask, for example of $SiO_2$, of varying thickness at a single energy, for example, of about 1 MeV. This varies the energy of ions reaching different regions, resulting in different concentrations of defects in the semiconductor. A thin $SiO_2$ layer will slow down the ions so that they will reach the surface of the semiconductor slower than they would in the absence of the mask, and hence will result in a smaller bandgap shift. A very thick mask will stop the ions completely and will result in no shift. Therefore, by varying the thickness of the mask, the degree of damage can be controlled. The mask may be removed prior to thermal treatment, although this is not necessary.

In another embodiment, the ions are implanted through a mask of varying density to achieve a similar result. In other embodiments, alternative techniques are employed to vary the dosage in a spatially selective manner.

The inventive technique works because of dependence of the shift in quantum well bandgap on defect concentration, which in turn is dependent on ion energy and/or dosage. The greater the dose, or the higher the energy of the implanted ions, the more damage that will be done. This invention provides the enabling technology for the integration and modification of optoelectronic components on a monolithic structure.

The invention also provides an apparatus for bandgap tuning a quantum well heterostructure comprising means for implanting ions in said heterostructure to create defects therein, and means for thermally treating heterostructure to initiate intermixing in the quantum well region, characterized in that it further comprises means for controlling the ion implantation in a spatially selective manner so as that different regions of said heterostructure have different concentrations of defects, which during the subsequent thermal treatment give rise to different bandgap shifts.

In a preferred embodiment, the invention also includes means for providing a mask of varying thickness or density on the surface of said heterostructure so that different regions are implanted with ions having different energies during a single ion implantation, thereby providing varying bandgap energies to various areas of said heterostructure to obtain controlled bandgap shifts in said heterostructure, and means for removing the mask prior to annealing.

The invention will now be described in more detail, by way of example only, with reference to the accompanying drawings, in which.

Figure 1:
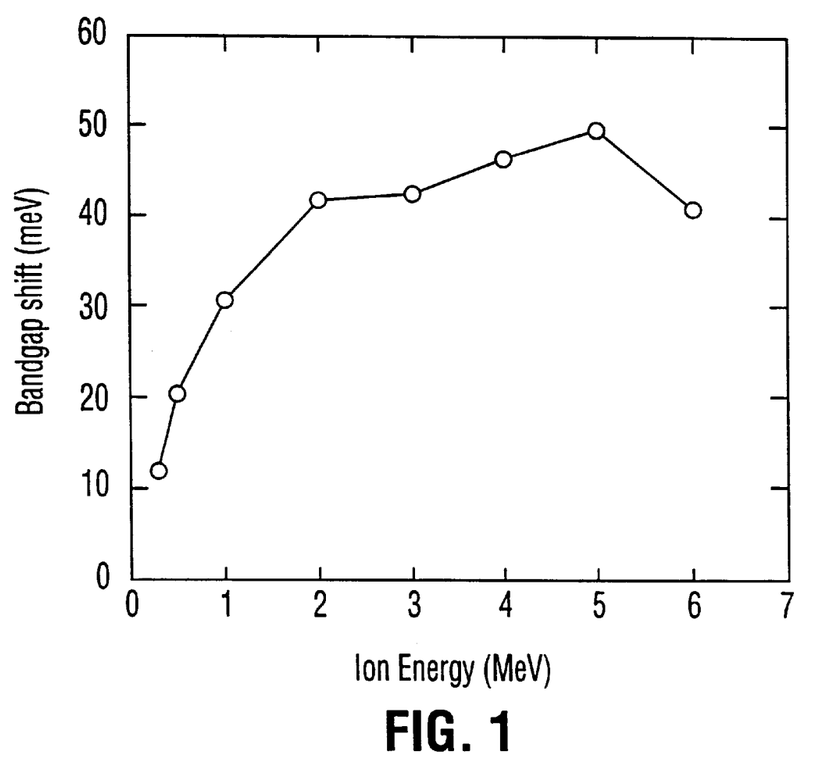
FIG. 1 shows the change in quantum well bandgap due to ion implantation into an unmasked structure at different ion energies for an InP based quantum well laser.

FIG. 1 shows the change in quantum well bandgap with ion implantation energy for an InP based quantum well laser. This has been implanted with different energy P ions at a dose of $2.5 \times 10^{13}$ cm$^{-2}$, and then annealed at 700° C. for 60 seconds. As can be seen from FIG. 1, there is a strong dependence of bandgap shift on ion energy up to 2 MeV. By implanting, for example, 2 MeV ions through a $SiO_2$ mask using standard technology compatible with InP processing, any bandgap shift from 0 to 41 meV can be obtained with a single ion implant. This can be performed purely by varying the mask thickness, although other means to vary the implanted dose can be employed.

Figure 2A:
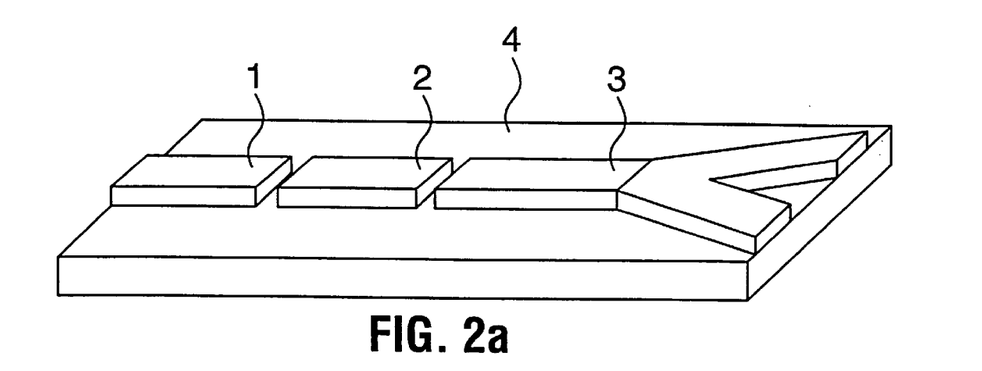
FIG. 2(a) shows a typical photonic circuit that has been created using this technique.

FIG. 2(a) shows a typical photonic circuit that can be created using the above technique. It consists of a laser 1, a modulator 2, which controls the output of the laser 1, and a waveguide 3 to send the light to another region of the wafer 4, or an optical fiber.

Figure 2B:
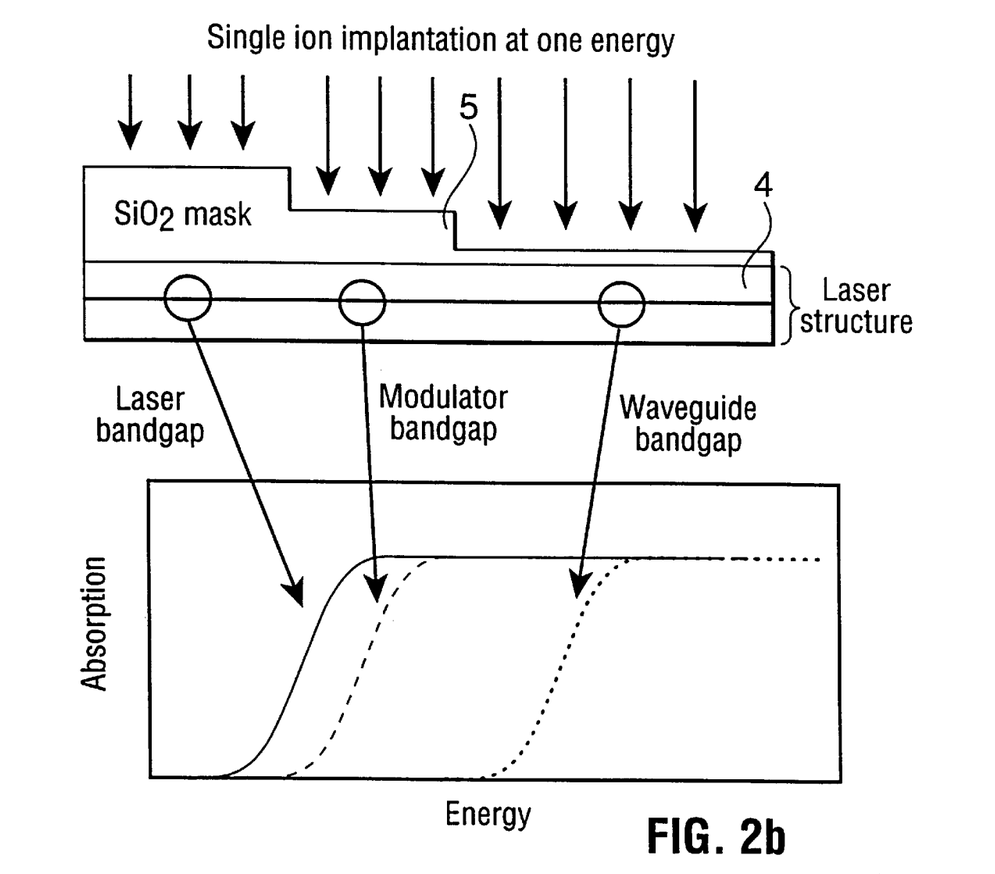
FIG. 2(b) shows a $SiO_2$ masking pattern that is used in a method according to the invention and the resulting different shifts in bandgap caused by ions of different energies.

By using an $SiO_2$ mask 5 of varying thickness, as shown in FIG. 2(b), different defect concentrations are created in different regions of the wafer using a single ion implantation step. As ions travel through the $SiO_2$ they are slowed down, i.e. they decrease in energy. The thicker the $SiO_2$, the more the ions are slowed, until they are stopped completely. The mask is implanted with ions of a single energy, e.g. 1 MeV, but the surface of the wafer actually receives ions with different energies, 0 to 1 MeV, depending on the thickness of the $SiO_2$ that the ions travel through. The resulting wafer is annealed, causing different shifts in bandgap for the different regions. The result is a bandgap profile suitable for the fabrication of a photonic integrated circuit.

Using this process, a standard quantum well laser wafer can be processed into any photonic integrated circuit simply by changing the $SiO_2$ mask used for implantation. For example, the wafer used to create the device shown in FIG. 2(a) could easily have been used to make a sensor for detecting a specified chemical compound. A tuned laser/detector pair would be made with an air gap between them. The presence of the specified chemical in the air gap would lead to an absorption of the laser light, and a drop in the signal from the detector.

Figure 3:
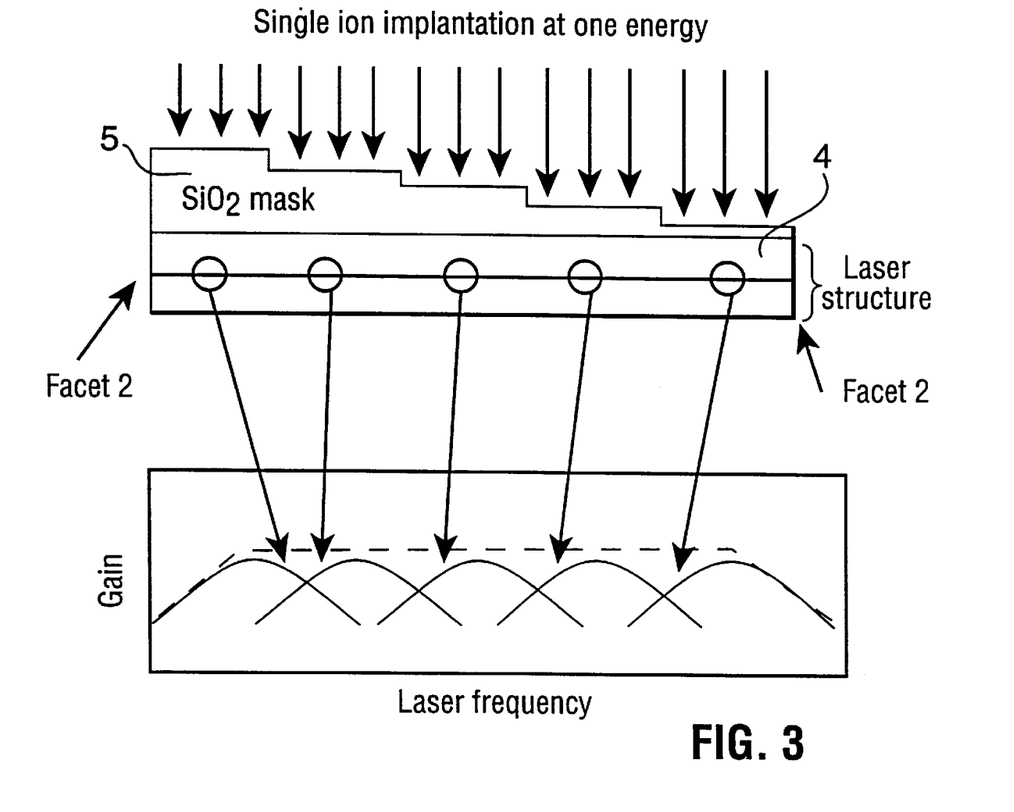
FIG. 3 shows a precursor of an extended spectrum super luminescent diode (SLD) and the output spectrum of the resulting.

New devices can also be implemented, such as an extended-gain-spectrum laser or an extended spectrum super luminescent diode (SLD) shown in FIG. 3. Normally, the output spectrum of an SLD is directly limited to the gain spectrum, which is typically 20–30 nm. There are numerous applications, such as fiber based gyroscopes and broad band illumination sources for spectroscopy, for SLDs with an output spectrum approaching 100 nm or greater. To extend the output spectrum of this device, a variable thickness mask is used along the length of the laser cavity (FIG. 3a). After ion implantation, the gain spectrum is shifted in wavelength by different amounts in different sections of the cavity (FIG. 3b). This results in a total gain spectrum, the dashed line, which is almost flat, and covers a wider frequency range than the untreated material.

The addition of a high reflecting coating on the Facet 1 (FIG. 3(a)) and anti-reflection coating on Facet 2 (FIG. 3a) results in a uni-directional extended spectrum SLD. Mirrors on both facets result in an extended-gain-spectrum laser. With anti-reflection coatings on both facets, an amplifier can be made with an extended wavelength gain.

It is also possible to practice the invention using multiple masks and multiple implants, In such an embodiment, for example, each density region can be exposed for a desired length of time through a mask having an aperture over the associated region where implantation is desired. Different masks can be exposed for a different length of time so as to vary the density of ion implantation between regions. Alternatively, the apertures in the successive masks could overlap so that the regions of higher desired defect density received higher doses.

In a further embodiment, instead of varying the thickness of the mask, it is possible to vary the density. This can be achieved, for example, by depositing an $SiO_2$ mask on some regions of the surface of the heterostructure and then sputtering metal on other regions where it is desired to have a higher density mask.

Figure 4:
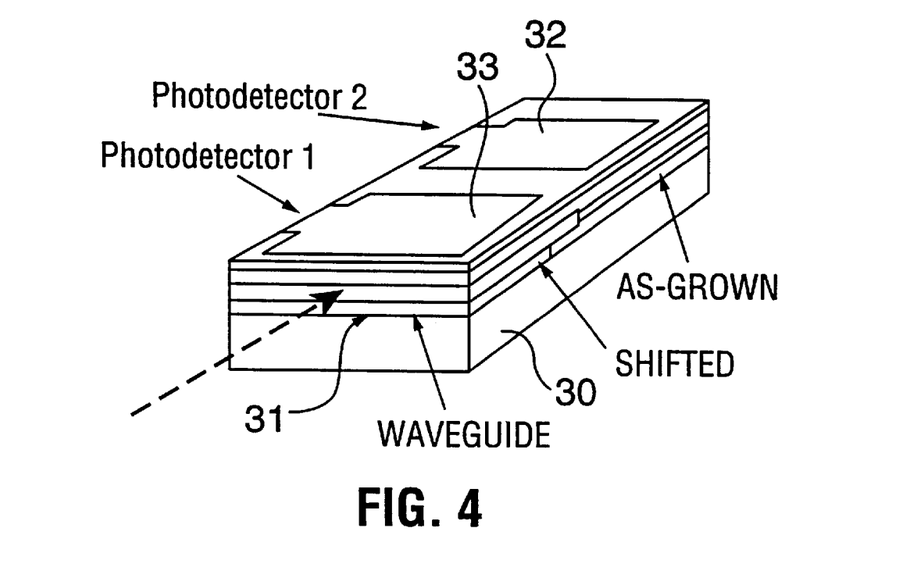
FIG. 4 is a schematic diagram of two sections of a demultiplexer fabricated in accordance with the invention.

In FIG. 4, a monolithic demultiplexer comprises a substrate 30 and an InP based laser structure 31. Photodetectors 32, 33 are formed over different regions of the structure, which has been subjected to bandgap tuning in accordance with the invention. In the structure of FIG. 4, four different thicknesses (0, 0.65, 1.2 and 2.2 μm) of $SiO_2$ mask were evaporated onto the sample surface. Phosphorus ions were implanted into the sample through the mask at a dose of $2.5 \times 10^{13}$ cm$^{-2}$ with an energy of 1 MeV. The thickest $SiO_2$ region was designed to stop the 1 MeV ions completely. During implantation the sample was tilted at and angle of 7° C. to the surface normal to minimize ion channeling.

After ion implantation the mask was removed. This was followed by an anneal at 700° C. for 90 seconds in a nitrogen atmosphere, using a Heatpulse 410 Rapid Thermal Annealer. During the annealing, the defects diffused rapidly through the InP material and the quantum well (QW) region causing an intermixing of the QW and barrier layers. This resulted in a shift of the QW absorption edge that was greatest for the region which had had no $SiO_2$ mask above it, and decreased as the $SiO_2$ mask layers increased in thickness. The region under the thickest $SiO_2$ layer had no shift in the QW absorption edge at all.

Separate gold contact pads were put on each of the differently masked regions to create a photodetector array. Light was coupled into the structure passing from the strongly intermixed into the non-intermixed region. Since the QW bandgap in each of the masked regions was different, the wavelength response for each was modified.

Figure 5:
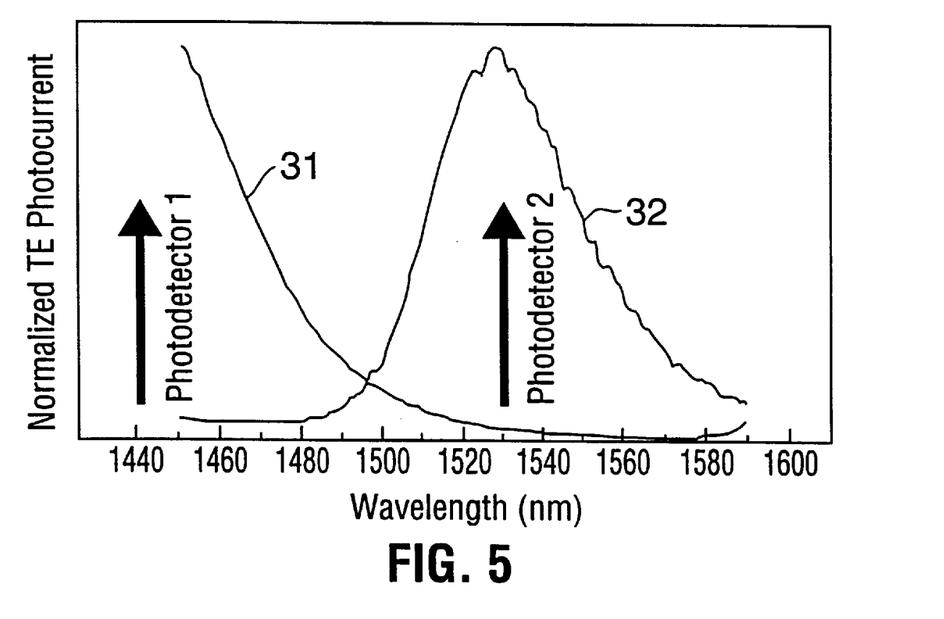
FIG. 5 shows the wavelength response of the two photodetectors in the demultiplexer.

As can be seen in FIG. 5, the response of photodetector 1, which lies over the bandgap shifted region, is shifted about 80 nm to the left.

This simple device allows the demultiplexing of a wavelength division multiplexed signal.

Figure 6:
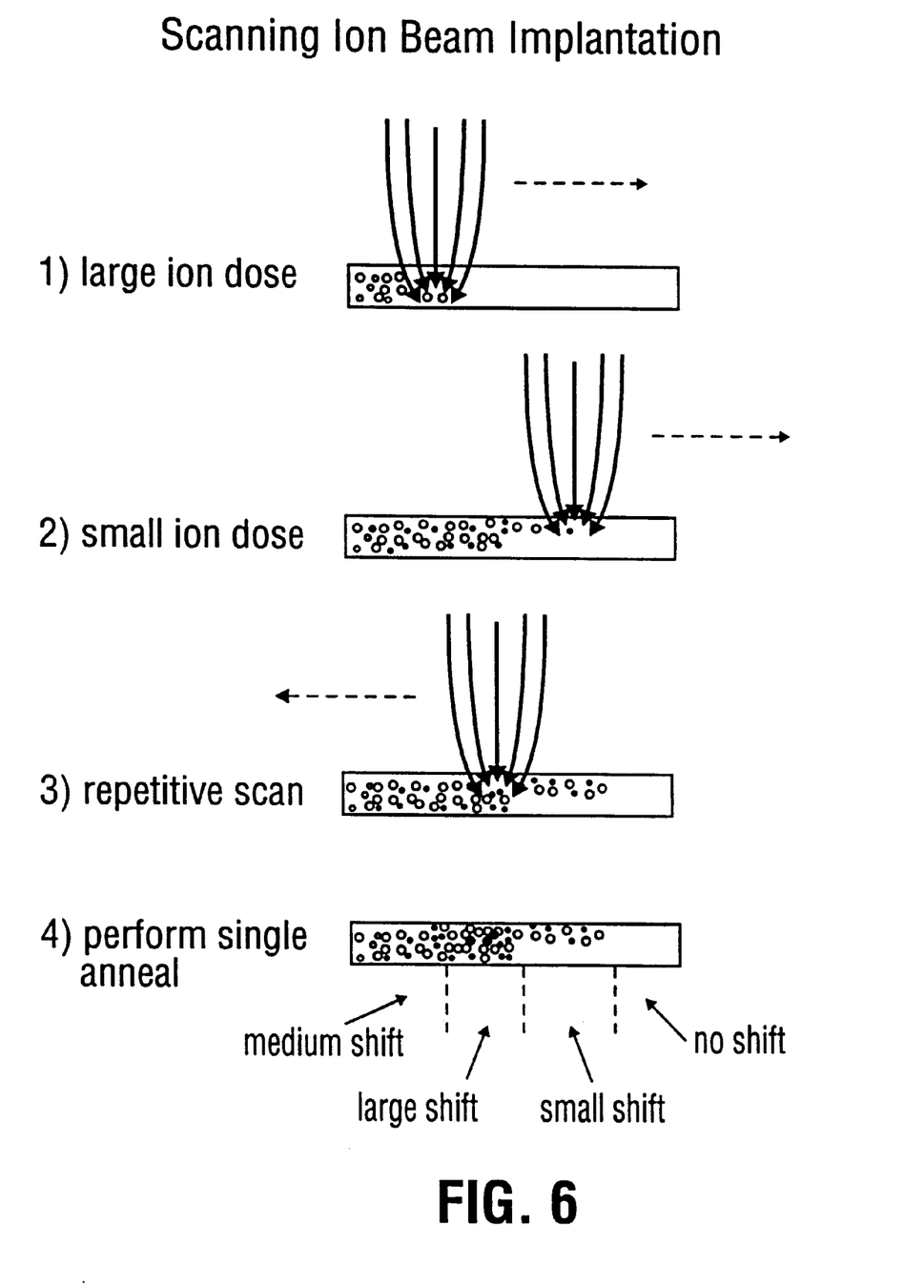
FIG. 6 shows an alternative embodiment using focused ion implantation.

In an alternative method of manufacture, shown in FIG. 6, regions having different concentrations of defects are created by using a scanning microbeam or projection ion beam system. A suitable practical example is a focused ion beam (FIB) machine. By varying the ion beam current, or by repetitive patterning, the number of defects can be adjusted in a lateral manner on the wafer. In step 1, the left side of the wafer is subjected to a large ion dose, and in step 2, the right side is subjected to a small ion dose.

After a repetitive scan in step 3, the wafer is subjected to a single rapid thermal anneal (RTA) in step 4 to effect a bandgap shift that depends on the concentration of defects, and thus the ion dose in the various regions. The Quantum well bandgap shifts reflect the defect density produced by the complex ion implantation pattern written on the wafer.

Figure 7:
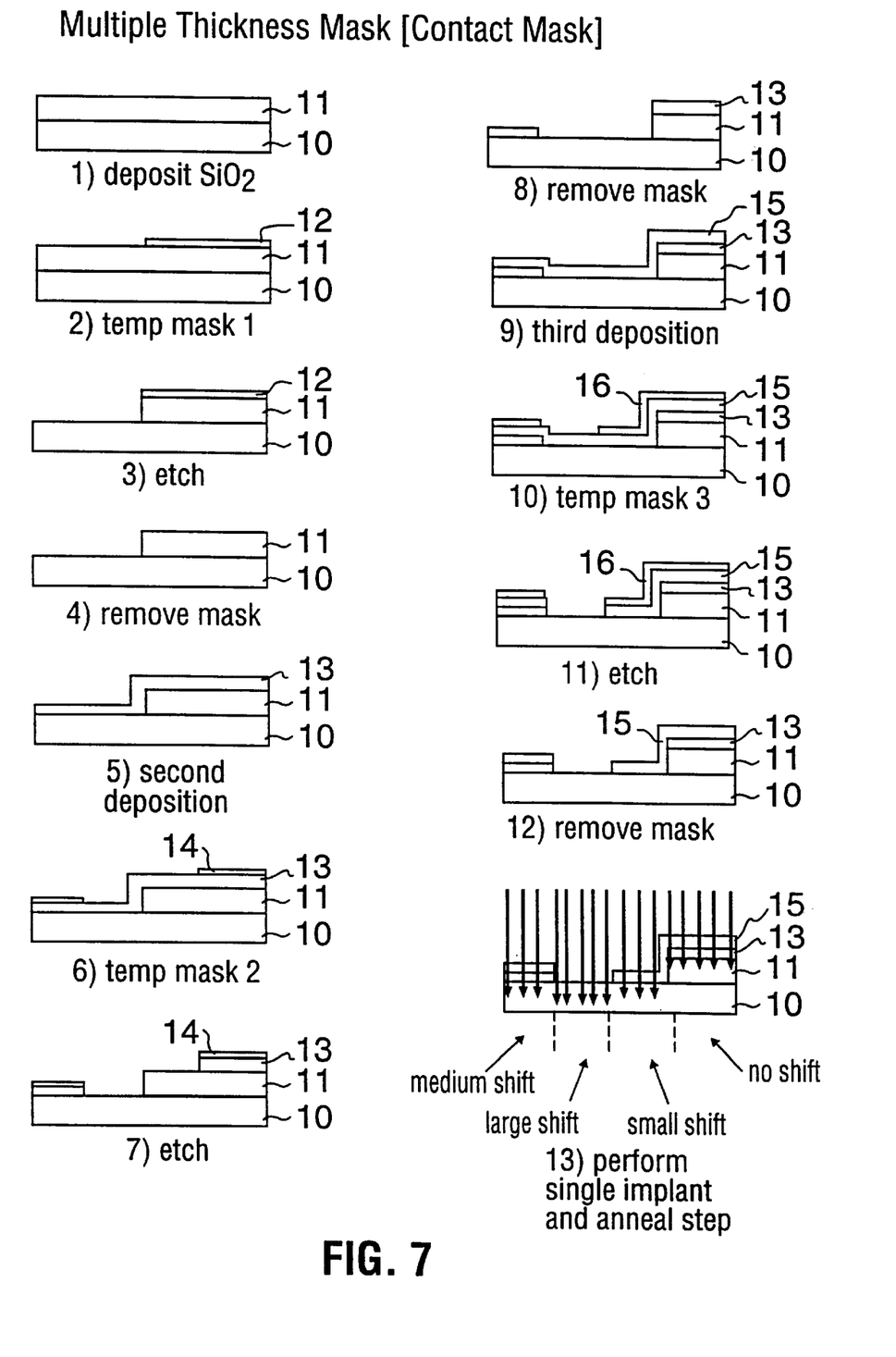
FIG. 7 shows an embodiment employing a multiple thickness mask.

FIG. 7 shows in detail a method of making a wafer employing a single, multiple thickness mask. After despositing an $SiO_2$ layer 11 on wafer surface 1 (step 1), a temporary mask 12 is applied to cover a portion of the wafer surface, and a deep etch (step 3) is performed on the remainder. The temporary mask 12 is removed and a second $SiO_2$ deposition 13 performed. The process is repeated through steps 6 to 12 adding additional $SiO_2$ layers 15 and employing masks 14, 16 to produce a multiple thickness mask as shown at step 12. Finally, in step 13, the wafer is subjected to ion implantation. Clearly, the exposed region receives the greatest ion dose and thus exhibits the greatest band gap shift.

Figures 8A, 8B:
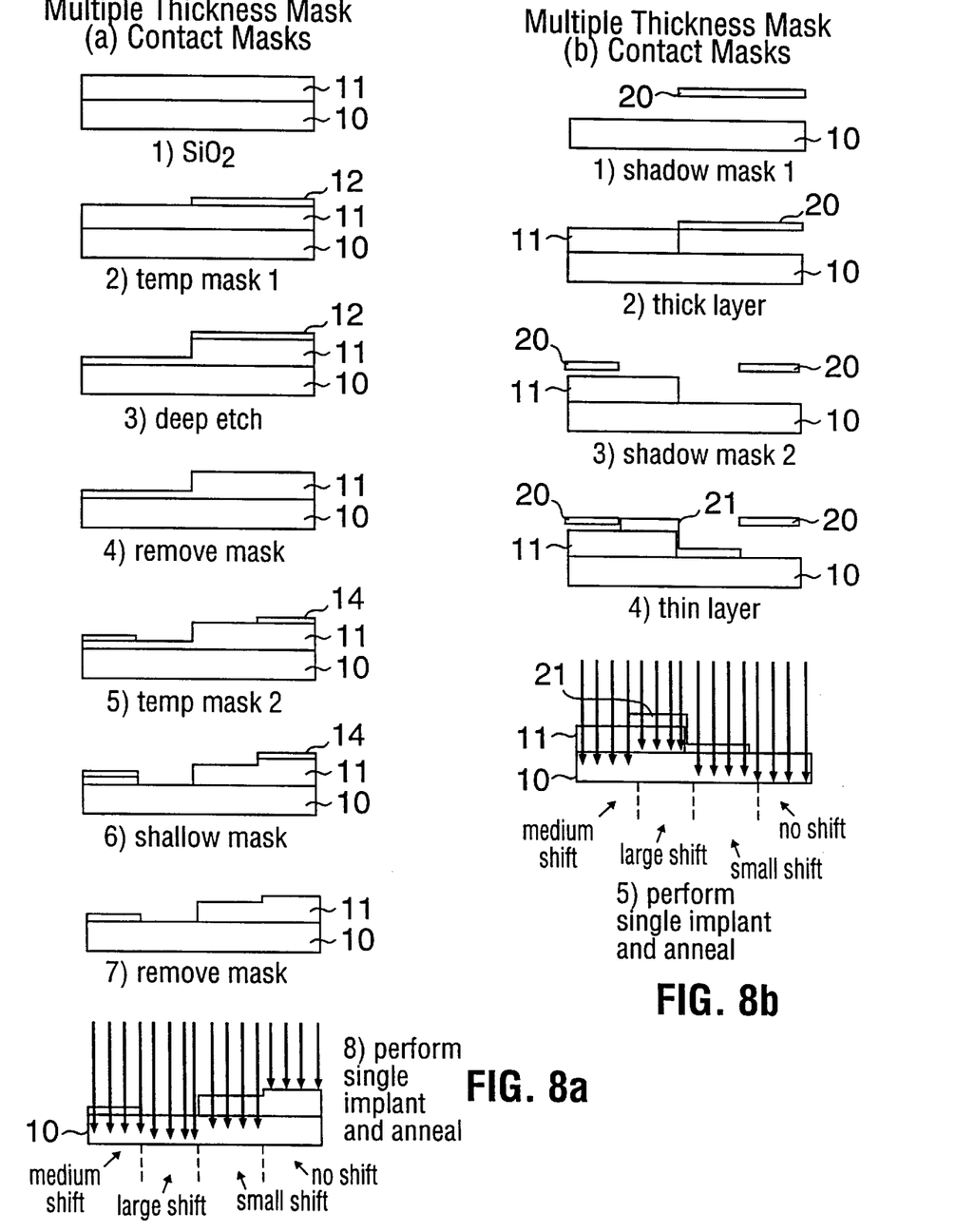
FIG. 8a shows a further embodiment employing a multiple thickness contact mask.
FIG. 8b shows an embodiment employing a multiple thickness contact mask created using a shadow masking technique.

FIG. 8a shows the use of a single multiple thickenss contact mask. As in FIG. 7, an $SiO_2$ mask 11 is formed on the surface of the wafer 10. A temporary mask 12 applied to cover parts of the exposed surface. A deep etch (step 3) is then performed and the temporary mask 12 removed. A second temporary mask 14 is applied and a shallow etch performed, which after removal of the mask 14, produces the stepped structure shown in step 7.

An ion implantation is then performed as shown in step 8. The thicker the mask the lower the ion energy reaching the sample surface, and hence the lower the concentration of defects. Thus, after intermixing the region with no mask exhibits the largest bandgap shift, and the region under the thickest portion of the mask, which does not receive any ions, exhibits no shift at all.

FIG. 8*b* shows how a similar result can be achieved using a shadow mask 20. The stepped mask 11, 21 is built up in a series of steps where the region over which it is not desired to deposit an $SiO_2$ layer is covered with shadow mask 20. In step 5, a single implant and anneal is performed to create different densities of defects and thus different bandgap shifts.

Figure 9A:
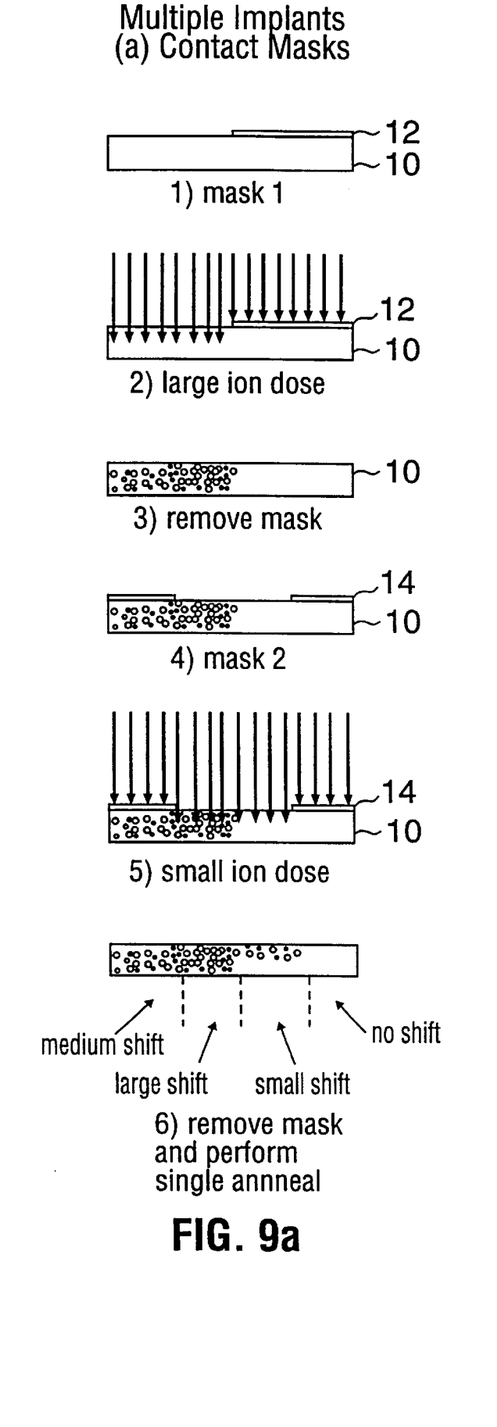
FIG. 9a shows multiple ion implants using contact masks.

FIG. 9*a* shows how a variable density defect concentration can be achieved using multiple implants with a single mask.

An ion implantation is performed through a first temporary mask 12 into the wafer 10. A second mask 14 is then applied over different regions and a second implantation carried out in step 5. The regions that are exposed more than once receive a greater dose of ions and thus have a greater defect concentration. After annealing, these have the greatest bandgap.

Figure 9B:
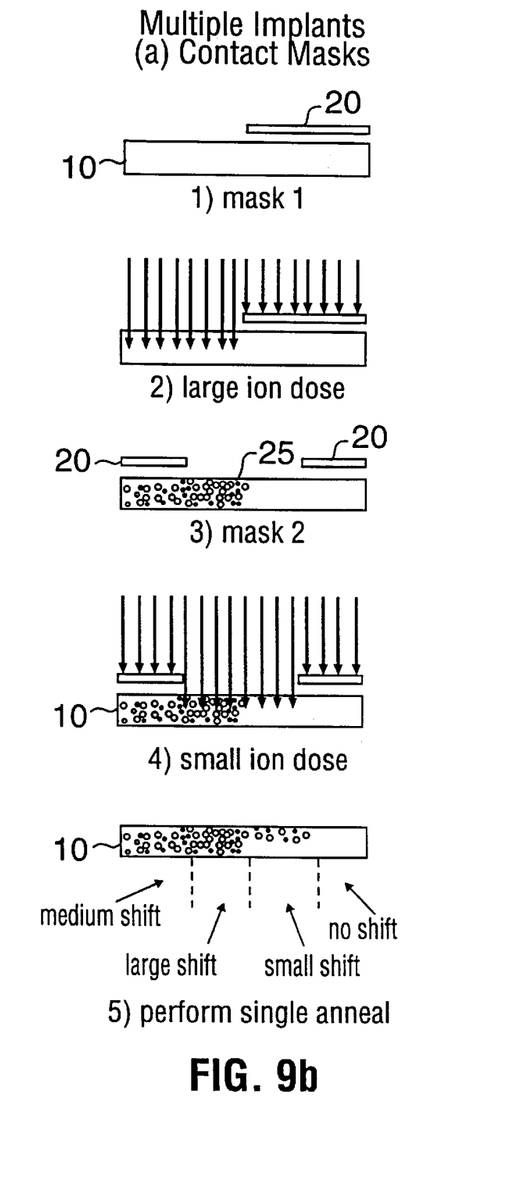
FIG. 9b shows multiple ion implants using shadow masks.

FIG. 9*b* shows a similar case for a shadow mask 20. Clearly, the exposed region receives the ions with the greatest energy and thus exhibits the greatest bandgap shift. The dose delivered by each implantation step differs, resulting in a wafer in which different areas experience different defect concentrations and thus shift differently during anneal. The anneal can be a single anneal, after all the doses have been applied, or separate anneals after each dose.

The described technique allows the monolithic integration of multi-use devices on a single substrate without deterioration of the material quality after the process.

We claim:

1. A method of bandgap tuning a quantum well heterostructure, comprising the steps of:

implanting into different regions of the heterostructure in a single-ion implantation step ions of different energy in a spatially selective manner to create defects therein, said ions being implanted through a mask of varying height to vary the energy of the ions reaching different regions of the heterostructure and thereby create different concentrations of defects in the different regions;

removing said mask; and subsequently annealing the heterostructure to initiate intermixing in the quantum well region and thereby result in different bandgap shifts in the different regions.

2. A method of bandgap tuning a quantum well heterostructure, comprising the steps of:

implanting into different regions of the heterostructure in a single-ion implantation step ions of different energy in a spatially selective manner to create defects therein, said ions being implanted through a mask of varying density to vary the energy of ions reaching different regions and thereby create different concentrations of defects in the different regions;

removing said mask, and subsequently annealing the heterostructure to initiate intermixing in the quantum well region and thereby result in different bandgap shifts in the different regions.

3. A method as claimed in claim 1 or 2, wherein the mask is an $SiO_2$ mask.

4. A method as claimed in claim 1, wherein the heterostructure is tilted at an angle of about 7° to minimize ion channeling during implantation.

5. A method as claimed claim 1, wherein the heterostructure is an extended gain super-luminescent diode.

6. A method as claimed as claimed in claim 1 or 2, wherein the heterostructure is annealed at about 700° for about 60 seconds.

7. A method of bandgap tuning a quantum well heterostructure, comprising the steps of:

implanting into different regions of the heterostructure ions of different energy in a spatially selective manner to create defects therein, said ions being implanted in multiple steps with different portions of the heterostructure being exposed through a mask at each implantation step, said different portions partially overlapping so that areas of overlap receive more than one implantation whereby the implantation dose in the different regions of the heterostructure varies and different concentrations of defects are created in the different regions; and subsequently annealing the heterostructure to initiate intermixing in the quantum well region and thereby result in different bandgap shifts in the different regions.

8. A method of bandgap tuning a quantum well heterostructure, comprising the steps of:

implanting into different regions of the heterostructure ions of different energy in a spatially selective manner to create defects therein, said ions being implanted in multiple steps with different portions of the heterostructure being exposed through a mask at each implantation step, said different portions being exposed for different lengths of time so that the implantation dose in the different regions of the heterostructure varies and different concentrations of defects are created in the different regions; and subsequently annealing the heterostructure to initiate intermixing in the quantum well region and thereby result in different bandgap shifts in the different regions.

* * * * *